s012026008B2

United States Patent
Chromczak et al.

(10) Patent No.: US 12,026,008 B2
(45) Date of Patent: Jul. 2, 2024

(54) TECHNIQUES FOR CLOCK SIGNAL TRANSMISSION IN INTEGRATED CIRCUITS AND INTERPOSERS

(71) Applicant: Intel Corporation, Santa Clara, CA (US)

(72) Inventors: Jeffrey Chromczak, Toronto (CA); Chooi Pei Lim, Penang (MY); Lai Guan Tang, Penang (MY); Chee Hak Teh, Penang (MY); MD Altaf Hossain, Portland, OR (US); Dheeraj Subbareddy, Portland, OR (US); Ankireddy Nalamalpu, Portland, OR (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 17/973,428

(22) Filed: Oct. 25, 2022

(65) Prior Publication Data

US 2023/0049681 A1 Feb. 16, 2023

Related U.S. Application Data

(62) Division of application No. 16/367,925, filed on Mar. 28, 2019, now Pat. No. 11,500,412.

(51) Int. Cl.
*G06F 1/10* (2006.01)
*H01L 23/00* (2006.01)
*H01L 23/31* (2006.01)
*H01L 23/538* (2006.01)

(52) U.S. Cl.
CPC .............. *G06F 1/10* (2013.01); *H01L 23/3114* (2013.01); *H01L 23/5381* (2013.01); *H01L 24/14* (2013.01); *H01L 24/16* (2013.01); *H01L 2224/14131* (2013.01);
(Continued)

(58) Field of Classification Search
None
See application file for complete search history.

(56) References Cited

U.S. PATENT DOCUMENTS

| | | | |
|---|---|---|---|
| 6,730,540 B2 | 5/2004 | Siniaguine | |
| 8,901,961 B1 * | 12/2014 | Ngai | H03K 19/177 326/39 |
| 9,030,253 B1 | 5/2015 | Ngai | |

(Continued)

*Primary Examiner* — Jany Richardson
(74) *Attorney, Agent, or Firm* — InventIQ Legal LLP; Steven J. Cahill

(57) ABSTRACT

An integrated circuit die includes input buffer circuits that are enabled during an input mode of operation in response to first control signals to transmit input signals into the integrated circuit die from conductive bumps. Each of the input buffer circuits is coupled to one of the conductive bumps. The integrated circuit die also includes output buffer circuits that are each coupled to one of the conductive bumps. The output buffer circuits are enabled during an output mode of operation in response to second control signals to transmit output signals from the integrated circuit die to the conductive bumps. The input buffer circuits are disabled from transmitting signals during the output mode of operation in response to the first control signals. The output buffer circuits are disabled from transmitting signals during the input mode of operation in response to the second control signals.

19 Claims, 7 Drawing Sheets

(52) U.S. Cl.
CPC ............... *H01L 2224/14133* (2013.01); *H01L 2224/14515* (2013.01); *H01L 2224/16227* (2013.01)

(56) References Cited

U.S. PATENT DOCUMENTS

| | | | |
|---|---|---|---|
| 9,099,999 B1 * | 8/2015 | Wang | H03K 17/00 |
| 9,543,965 B1 | 1/2017 | Ding et al. | |
| 2010/0200998 A1 * | 8/2010 | Furuta | H01L 25/18 |
| | | | 257/777 |

* cited by examiner

TECHNIQUES FOR CLOCK SIGNAL TRANSMISSION IN INTEGRATED CIRCUITS AND INTERPOSERS

CROSS-REFERENCE TO RELATED APPLICATION

This patent application is a divisional of U.S. patent application Ser. No. 16/367,925, filed Mar. 28, 2019, which is incorporated by reference herein in its entirety.

FIELD OF THE DISCLOSURE

The present disclosure relates to electronic circuits, and more particularly, to techniques for transmitting signals in integrated circuit dies.

BACKGROUND

In leading-edge process technologies that are used to manufacture integrated circuits, the parasitic resistance and capacitance in the metal layers do not improve as silicon features shrink (e.g., transistor device scaling). Techniques such as the promotion of one metal layer to multiple metal layers can be used to accommodate routing in smaller process technologies. Clock networks, for example, benefit from ideal metal characteristics. Previous solutions have used top-metal layers that are coarser and that enable better clock distribution characteristics at the cost of routing densities.

DETAILED DESCRIPTION

Figure 1A:
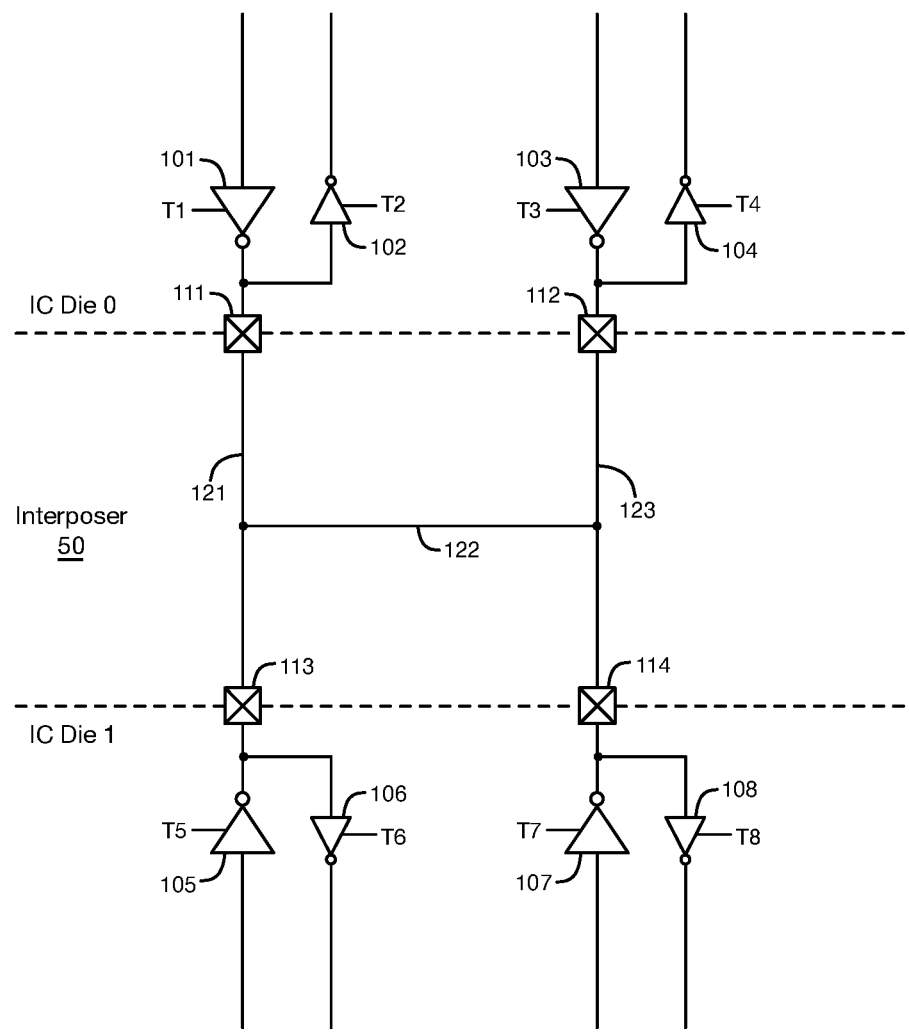
FIGS. 1A-1C illustrate an example of a circuit system having a global clock distribution network in an interposer that provides a global clock signal to two integrated circuit dies, according to an embodiment.

Global clocking in integrated circuits makes modular design difficult, because global clock networks are implemented on the same integrated circuit die as logic fabric, which limits scalability. Balanced clock distribution is also difficult in multi-die systems, because die-to-die interposer crossings have very large delay that introduces topological skew, and die-to-die process variations can introduce significant delay mismatch in nominally matched clock signals. In multi-chip integration architectures, clock networks have to absorb clock skews caused by inter-die variations and intra-die variations. Adding additional metal layers in leading-edge process nodes increases cost. Highly scaled nodes are optimized for density and not bulk drive. Transistors in leading-edge technologies may be worse at driving high-capacitance long-distance clock networks compared to older nodes.

According to some embodiments disclosed herein, one or more integrated circuit dies are mounted on an active or passive interposer. A global clock distribution network that provides one or more global clock signals to the integrated circuit dies is located in the interposer. The interposer typically has large pitch conductive layers that are optimized for larger loads, such as global clock signals. Because the global clock distribution network is in the interposer, global clock routing does not need to consume conductive layers in the integrated circuit dies. Conductive layers in the integrated circuit dies that were previously used for global clock routing can be reverted back to signal routing, or the conductive layers can be removed. If the interposer is an active interposer, drivers used for global clock routing can be removed from the integrated circuit dies and moved to the active interposer, which saves integrated circuit die area for other uses. As an example, moving a global clock distribution network to an interposer can save more than 5% die area in an integrated circuit.

With a passive or an active interposer as a base die, the interposer routing can be used for low-skew distribution of a common clock signal to multiple integrated circuit dies and for balanced re-convergence of clock network leaf nodes to implement de-skew between clock signals. Low-skew distribution of a common clock signal to multiple integrated circuit (IC) dies can increase feasible transfer frequency between IC dies by 2 times or more, more than doubling IC die-to-die bandwidth. Interposer technology enables the creation of conductive routing designed for a specific purpose (e.g., global clock distribution). Because global clock routing is moved to the interposer, the electrical characteristics of the fabric routing resources at identical metal layers in the IC dies are improved, and thus the electrical characteristics of the signals transmitted through the fabric routing resources in the IC dies are also improved. Any skew between clock signals caused by inter-die variations is reduced by phase detectors and adjustable delay circuits in one or more of the IC dies, as disclosed in further detail herein.

Figure 1B:
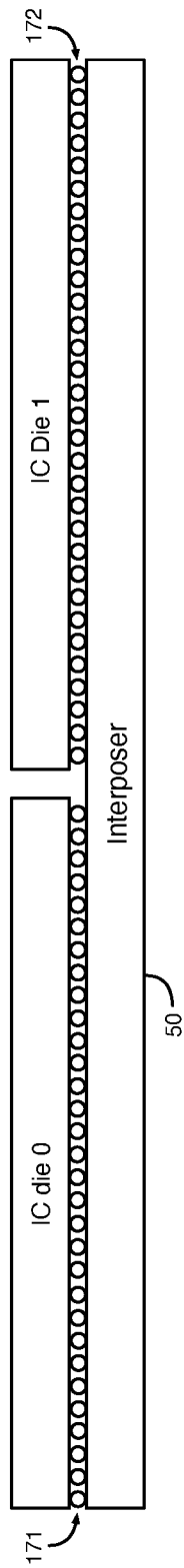
Figure 1C:
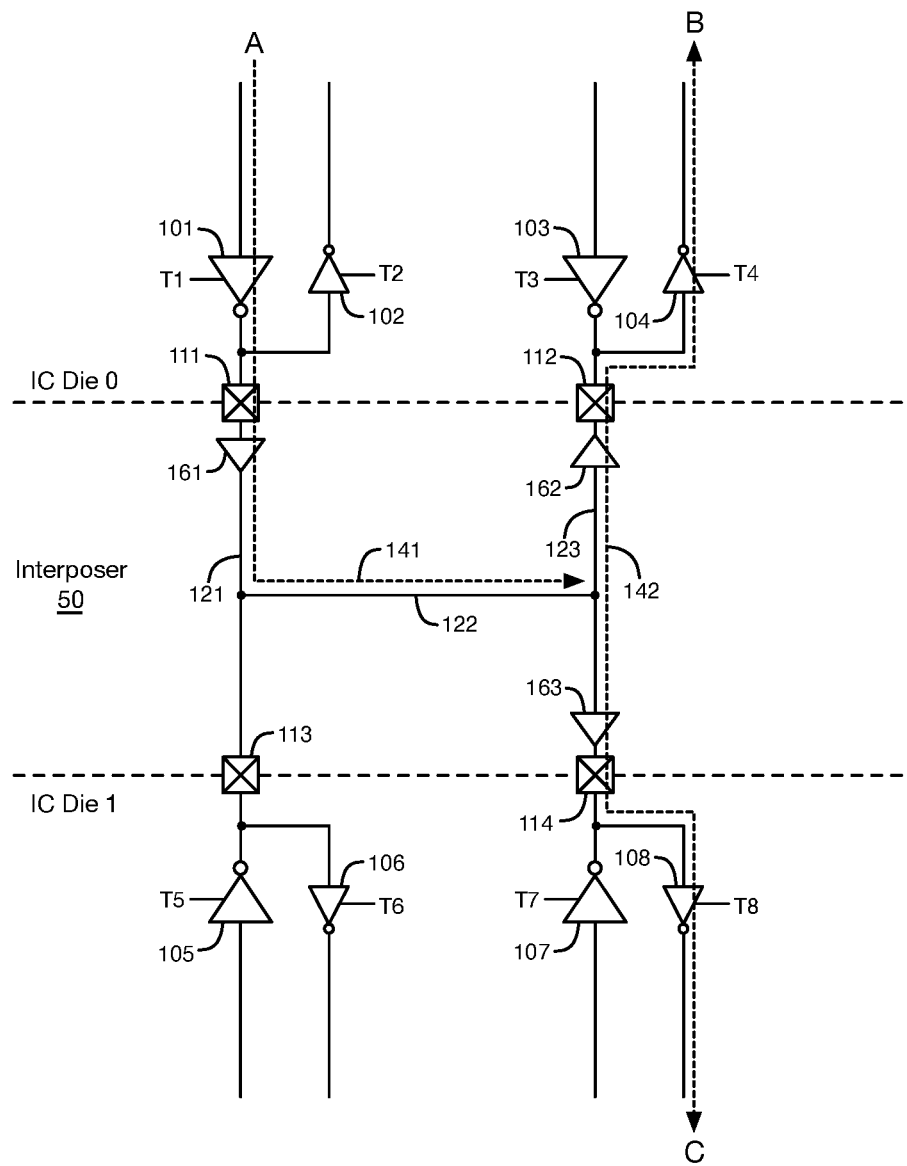

FIGS. 1A-1C illustrate an example of a circuit system having a global clock distribution network on an interposer that provides a global clock signal to two integrated circuit dies, according to an embodiment. Figures (FIGS. 1A-1C illustrate two integrated circuit (IC) dies, IC die 0 and IC die 1, and an interposer 50 (e.g., a silicon interposer). In the embodiment of FIG. 1A, interposer 50 can be an active interposer or a passive interposer. IC die 0 includes output buffer circuits 101 and 103, input buffer circuits 102 and 104, and conductive input/output (I/O) pads 111-112. IC die 1 includes output buffer circuits 105 and 107, input buffer circuits 106 and 108, and conductive I/O pads 113-114. Buffer circuits 101-108 are tri-state buffer circuits that are enabled and disabled in response to control signals T1-T8, respectively. Interposer 50 includes conductors 121-123 that are connected in a balanced H-tree structure topology. FIGS. 1A and 1C illustrate top down views of the circuit system.

Conductors in interposer 50, including conductors 121-123, are used as a global clock distribution network to route one or more global clock signals to, from, and/or between IC dies 0 and 1. A global clock distribution network is also referred to herein as a global clock network. The global clock network in interposer 50 can be used to route one or more global clock signals to two or more IC dies mounted on the interposer 50. Two of the IC dies may be placed side-by-side on the interposer 50. The clock crossings have two bi-directional buffer circuits on each IC die and interposer tracks 121-123 connected in a balanced H-tree topology in the interposer 50. The H-tree clock structure can be implemented in active or passive interposers. In some exemplary embodiments, a small fraction of the total number of conductors in interposer 50 may be used as the global clock distribution network for routing one or more global clock signals to, from, and/or between IC dies.

The global clock distribution network in interposer 50, including conductors 121-123, is used to route one or more global clock signals to and from IC die 0 through one or more of pads 111-112 and buffers 101-104. A global clock signal can be transmitted from the global clock distribution network in interposer 50 to IC die 0, for example, through pads 111 or 112 and input buffers 102 or 104, respectively. The global clock signal can then, for example, be transmitted through one or more regional or local clock networks in IC die 0 to sequential logic circuitry in IC die 0. A global clock signal can be transmitted from IC die 0 to the global clock distribution network in interposer 50, for example, through output buffers 101 or 103 and pads 111 or 112, respectively.

The global clock distribution network in interposer 50, including conductors 121-123, is also used to route one or more global clock signals to and from IC die 1 through one or more of pads 113-114 and buffers 105-108. A global clock signal can be transmitted from the global clock distribution network in interposer 50 to IC die 1, for example, through pads 113 or 114 and input buffers 106 or 108, respectively. The global clock signal can then, for example, be transmitted through one or more regional or local clock networks in IC die 1 to sequential logic circuitry in IC die 1. A global clock signal can be transmitted from IC die 1 to the global clock distribution network in interposer 50, for example, through output buffers 105 or 107 and pads 113 or 114, respectively.

The integrated circuit (IC) dies 0 and 1 are coupled to the interposer 50 through conductive bumps in a 2.5D configuration, as shown, for example, in the side view of FIG. 1B. FIG. 1B is a diagram showing that IC die 0 is coupled to interposer 50 through conductive bumps 171 and that IC die 1 is coupled to interposer 50 through conductive bumps 172. The conductive bumps disclosed herein may be, for example, microbumps. Conductive bumps 171 are coupled between conductive I/O pads on IC die and conductive pads on the top surface of interposer 50. Conductive bumps 172 are coupled between conductive I/O pads on IC die 1 and conductive pads on the top surface of interposer 50.

Because of the large load of these bumps, the buffers 101-108, electrostatic discharge, and the conductors in the interposer 50 (e.g., large dimension wires or traces running long distances), the paths from buffers 101-108 through the clock network in interposer 50 from one IC die to another IC die typically add substantial delay to the signals that cross these paths, e.g., hundreds of picoseconds. This delay can add significant skew to the distribution of a clock signal between IC dies through interposer 50.

Also, there is often significant process variations between two or more different IC dies, such as between IC dies 0 and 1. The process variations between two IC dies may, for example, be as large as the worst case process variations between the slow (SS) and fast (FF) corner IC dies manufactured in a bin of IC dies. Because of these potentially large process variations between IC dies, a clock signal transmitted through a nominally matched clock distribution network can have very different delay on one IC die compared to another IC die (e.g., nanoseconds of clock skew). This potentially large clock skew makes synchronous transfers between IC dies very difficult to implement at a reasonable frequency.

When a common clock signal (e.g., a global clock signal) is distributed to more than one IC die, the interposer H-tree clock network structure can be used to create a delay-balanced branch point, as disclosed, for example, with respect to FIG. 1C. A common clock signal can be sourced from one IC die and re-routed back to that same IC die along one branch of a balanced clock distribution network in the interposer. The other branch of the clock distribution network in the interposer can route the common clock signal to the second IC die with the same nominal delay and very well matched physical delay, because one common buffer drives the clock signal to both IC dies. The common clock signal can then be re-distributed on each IC die using a delay matched clock distribution network.

FIG. 1C illustrates an example of signal paths that may be used to route a clock signal between IC dies 0 and 1 through a balanced H-tree clock network in interposer 50. In the embodiment of FIG. 1C, interposer 50 is an active interposer that incudes buffers circuits 161-163 formed by transistors. In the example shown in FIG. 1C, a clock signal A is routed from IC die 0 through output buffer 101 and pad 111 to interposer 50. Clock signal A is then buffered by buffer circuit 161 in interposer 50 and routed through conductors 121-122 in interposer 50, as shown by the dotted arrow 141 in FIG. 1C. Clock signal A is then routed through conductor 123 and buffered by buffer circuits 162 and 163 in interposer 50. The buffered clock signals are then provided to IC die 1 through pad 114 and to IC die 0 through pad 112, as shown by dotted arrow 142 in FIG. 1C. Input buffer 104 buffers the buffered clock signal received at pad 112 to generate clock signal B in IC die 0. Input buffer 108 buffers the buffered clock signal received at pad 114 to generate clock signal C in IC die 1. Clock signals B and C are then re-distributed in IC dies 0 and 1 using delay matched clock distribution networks. Clock signals B and C are nominally matched (i.e., ideally have zero clock skew), because the global clock network in interposer 50 (including conductors 121-123 and buffers 161-163) is structured as a balanced H-tree clock network, and input buffers 104 and 108 have the same circuit architecture and ideally have the same nominal delay.

Even though two copies of the clock distribution network in IC dies 0 and 1 that route clock signals B and C are nominally identical, they can have significant delay mismatch due to process variations between IC dies 0 and 1. According to some embodiments, phase detection circuitry can be used to measure clock skew at leaf nodes of the clock distribution networks within multiple IC dies and to enable clock skew compensation, as disclosed herein, for example, with respect to FIGS. 2-3.

Figure 2:
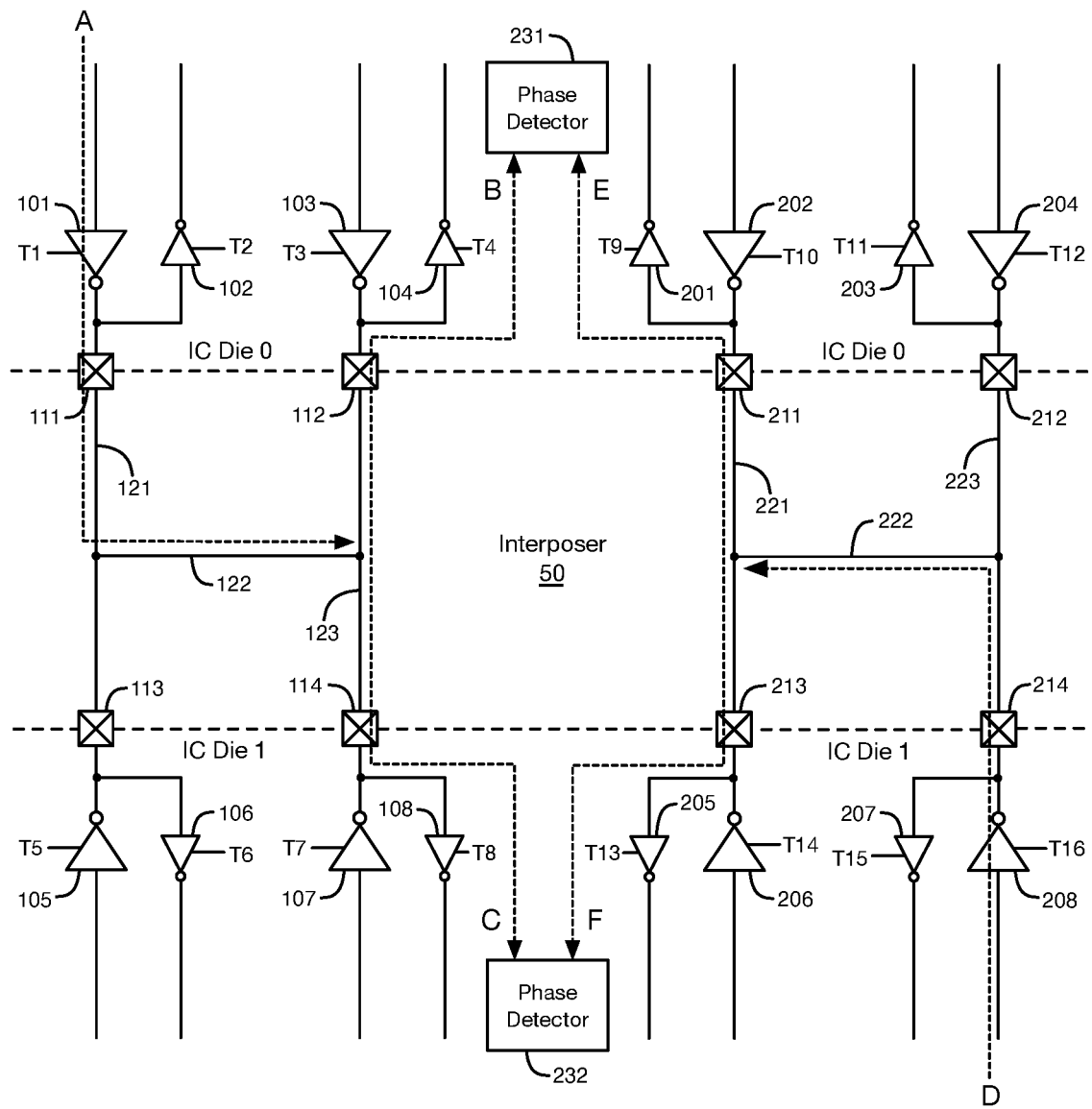
FIG. 2 illustrates an example of a circuit system having a global clock distribution network in an interposer and phase detection circuitry for detecting clock skew at leaf nodes of clock distribution networks in two integrated circuit dies, according to an embodiment.

FIG. 2 illustrates an example of a circuit system having a global clock distribution network in an interposer and phase detection circuitry for detecting clock skew at leaf nodes of clock distribution networks in two integrated circuit dies, according to an embodiment. FIG. 2 illustrates the circuitry and conductors shown in FIGS. 1A and 1C and additional circuitry and conductors. The additional conductors shown in FIG. 2 include conductors 221-223 in interposer 50. Conductors 221-223 form a second balanced H-tree structure that is part of the global clock distribution network in interposer FIG. 2 also illustrates input buffer circuits 201 and 203 in IC die 0, output buffer circuits 202 and 204 in IC die 0, conductive I/O pads 211 and 212 on IC die 0, input buffer circuits 205 and 207 in IC die 1, output buffer circuits 206 and 208 in IC die 1, and conductive I/O pads 213-214 on IC die 1. Buffers 201-208 are tri-state buffers that are enabled and disabled in response to control signals T9-T16, respectively.

IC dies 0 and 1 also include phase detector circuits 231 and 232, respectively, as shown in FIG. 2. Phase detectors 231 and 232 can be used to detect and compensate for any phase errors between clock signals at leaf nodes of clock networks in IC dies 0 and 1. For example, a clock signal can be routed from IC die 0 through conductors 121-123 to pads 112 and 114 of IC dies 0 and 1, respectively, as disclosed herein with respect to FIG. 1C. Input buffer 104 buffers clock signal A to generate a clock signal B. Clock signal B is routed through a clock network (not shown) in IC die 0 to a first input of phase detector circuit 231. Input buffer circuit 108 buffers clock signal A to generate a clock signal C. Clock signal C is routed through a clock network (not shown) in IC die 1 to a first input of phase detector circuit 232.

As another example, a clock signal D in IC die 1 can be driven by output buffer circuit 208 through pad 214 and conductors 221-223 to pads 211 and 213 of IC dies 0 and 1, respectively. Input buffer 201 buffers clock signal D to generate a clock signal E. Clock signal E is routed through a clock network (not shown) in IC die 0 to a second input of phase detector circuit 231. Thus, phase detector 231 receives clock signals B and E at leaf nodes of two clock networks in IC die 0. The clock networks in IC die 0 that route clock signals B and E have the same nominal delay. Input buffer circuit 205 buffers clock signal D to generate a clock signal F. Clock signal F is routed through a clock network (not shown) in IC die 1 to a second input of phase detector circuit 232. Thus, phase detector 232 receives clock signals C and F at leaf nodes of two clock networks in IC die 1. The clock networks in IC die 1 that route clock signals C and F also have the same nominal delay.

The H-tree structure formed by conductors 221-223 has the same nominal delay as the H-tree structure formed by conductors 121-123. Phase detector circuit 231 detects and measures the phase offset between clock signals B and E to generate one or more phase error signals. The phase error signals generated by phase detector circuit 231 are then used to adjust the delay provided to one or more of clock signals A, B, D, and/or E on IC dies 0 or 1 to reduce or eliminate any clock skew between clock signals B and E. Phase detector circuit 232 detects and measures the phase offset between clock signals C and F to generate one or more phase error signals. The phase error signals generated by phase detector circuit 232 are then used to adjust the delay provided to one or more of clock signals A, C, D, and/or F on IC dies 0 or 1 to reduce or eliminate any clock skew between clock signals C and F.

Figure 3:
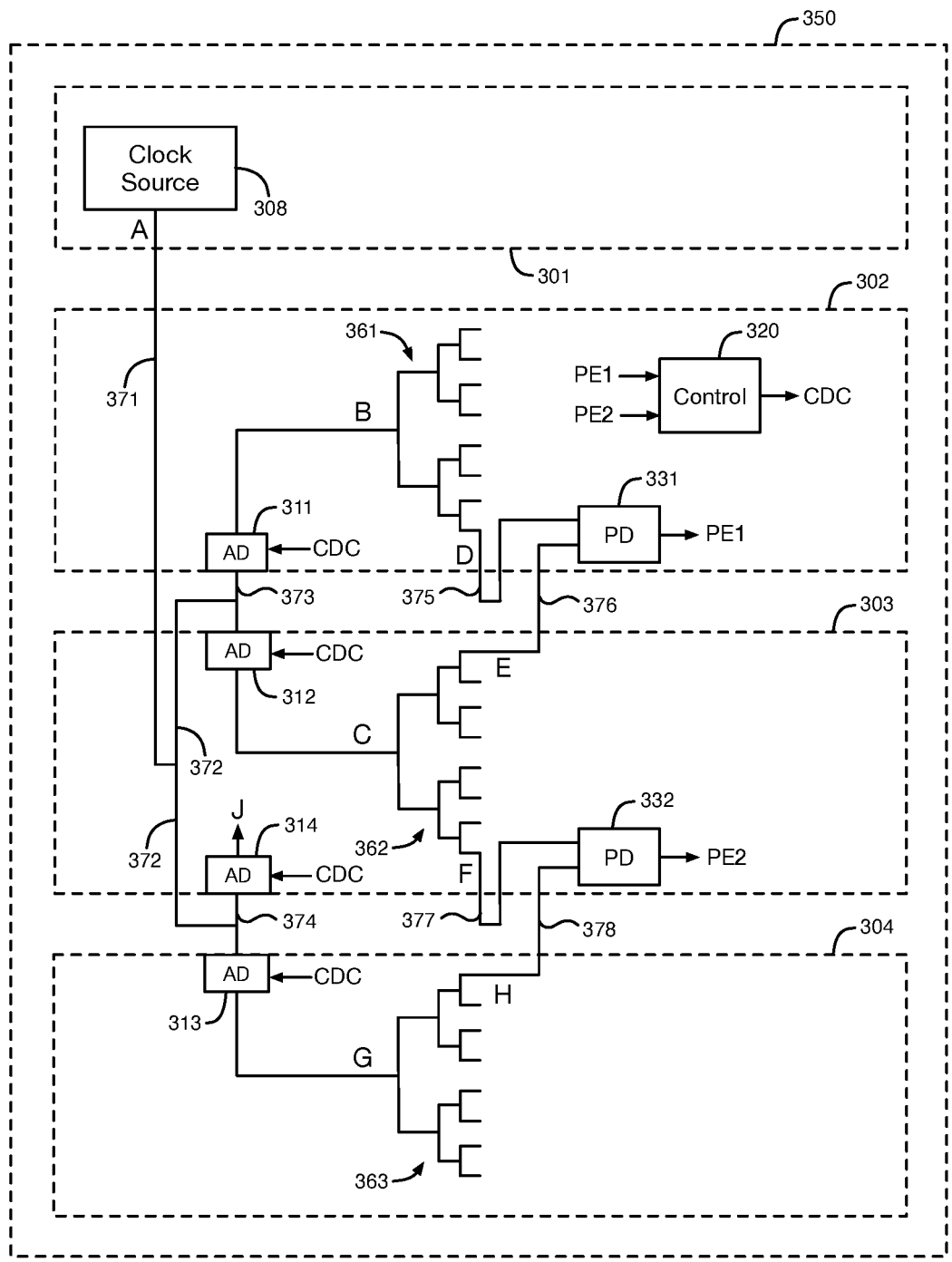
FIG. 3 illustrates an example of a circuit system having a clock network in an interposer and clock skew compensation circuitry, according to an embodiment.

FIG. 3 illustrates a top down view of an example of a circuit system having a clock network in an interposer and clock skew compensation circuitry, according to an embodiment. In the embodiment of FIG. 3, an interposer 350 includes a global clock distribution network that distributes a global clock signal between integrated circuit (IC) dies 301-304. IC dies 301-304 can be any types of IC dies, such as programmable logic integrated circuits (ICs), microprocessor ICs, graphics processing unit (GPU) ICs, etc. The global clock distribution network in interposer 350 includes conductors, such as conductors 371-378, for routing one or more clock signals. Interposer 350 can be an active interposer having conductors and clock buffer circuits or a passive interposer having conductors. The four IC dies 301-304 are mounted on interposer 350 and coupled to interposer 350 through conductive bumps (not shown).

IC die 301 includes a clock source circuit 308. Clock source (CS) circuit 308 can be, for example, a phase-locked loop (PLL) circuit or a delay-locked loop circuit. IC die 302 includes an adjustable delay circuit 311, an on-die local or regional clock network 361, a phase detector circuit 331, and a control circuit 320. Although the control circuit 320 is only shown in IC die 302 in FIG. 3, control circuit 320 may be in IC die 303, IC die 304, or in all 3 IC dies 302-304. IC die 303 includes adjustable delay circuits 312 and 314, an on-die local or regional clock network 362, and a phase detector circuit 332. IC die 304 includes an adjustable delay circuit 313 and a local or regional clock network 363. Adjustable delay circuits 311-314 can be, for example, adjustable delay chain circuits or any other types of adjustable delay circuits.

In the embodiment of FIG. 3, CS circuit 308 in IC die 301 generates a first clock signal A. Clock signal A is transmitted from CS circuit 308 through conductors in IC die 301 to interposer 350. The conductors in IC die 301 can be, for example, a dedicated clock network or a high quality fabric route. Clock signal A is then transmitted from IC die 301 through conductors 371-374 in interposer 350 to each of the other IC dies 302-304. Conductors 371-374 in interposer 350 form a balanced H-tree structure. For example, conductor 371 connects to the mid-point of conductor 372, and conductor 372 connects to the mid-points of each of conductors 373 and 374. Clock signal A is transmitted through conductors 371-373 to each of adjustable delay circuits 311 and 312 and through conductors 371-372 and 374 to each of adjustable delay circuits 313 and 314. Adjustable delay circuit 314 delays clock signal A to generate a delayed clock signal J that is transmitted to an additional clock network in IC die 303 (not shown) to sequential circuitry in IC die 303.

Adjustable delay circuit 311 delays clock signal A to generate a delayed clock signal B in IC die 302. Adjustable delay circuit 311 may also include an input buffer circuit that buffers clock signal A. Clock signal B is provided to an input of clock network 361. Clock signal B is transmitted through clock network 361 in IC die 302 to 8 leaf nodes of clock network 361. Clock network 361 is a balanced H-tree clock network, such that the clock signal at each of its 8 leaf nodes has the same nominal delay relative to clock signal B. It should be understood that 8 leaf nodes of clock network 361 are shown in FIG. 3 merely as an example and that on-die clock network 361 may have any number of branches and any number of leaf nodes. Clock signal D is generated at one of the leaf nodes of clock network 361 in response to clock signal B. Clock signal D is transmitted outside of IC die 302 (e.g., by an output buffer) to conductors 375 in interposer 350. Clock signal D is transmitted through a U-turn in conductors 375 having a U-shape back to an input pad of IC die 302. Clock signal D is then transmitted from the input pad of IC die 302 to a first input of phase detector circuit 331 (e.g., through an input buffer). Conductors 375 are part of the global clock distribution network in interposer 350. Conductors 375 have a balanced H-tree structure. For example, conductors 375 can be the upper part of a first set of the conductors 121-123 shown in FIGS. 1A and 1C.

Adjustable delay circuit 312 delays clock signal A to generate a delayed clock signal C in IC die 303. Adjustable delay circuit 312 may also include an input buffer circuit that buffers clock signal A. Clock signal C is provided to an input of clock network 362 in IC die 303. Clock signal C is transmitted through clock network 362 to 8 leaf nodes of clock network 362. It should be understood that 8 leaf nodes of clock network 362 are shown in FIG. 3 merely as an example and that on-die clock network 362 may have any number of branches and any number of leaf nodes. Clock network 362 is a balanced H-tree clock network, such that the clock signal generated at each of its 8 leaf nodes has the same nominal delay relative to clock signal C.

Clock signal E is generated at one of the leaf nodes of clock network 362 in response to clock signal C. Clock signal E is transmitted outside of IC die 303 (e.g., by an output buffer) to conductor 376 in interposer 350. Conductor 376 is part of the global clock distribution network in interposer 350. Clock signal E is then transmitted through conductor 376, through an input pad of IC die 302, and through an input buffer in IC die 302 to a second input of phase detector circuit 331.

Clock networks 361 and 362 have the same nominal delay from their origins at the adjustable delay circuits 311-312, respectively, to their leaf nodes. In addition, the signal paths that clock signals D and E travel from the leaf nodes of clock networks 361 and 362, respectively, to inputs of phase detector 331 have the same nominal delay. However, process variations between IC dies 302 and 303 may cause clock signals D and E to have a phase offset. The phase offset is a function of the true clock delay mismatch in the on-die re-distribution network and not any structural imbalance. Phase detector circuit 331 compares the phase of clock signal D to the phase of clock signal E to generate one or more phase error signals PE1. Phase detector circuit 331 causes the values of the one or more phase error signals PE1 to indicate any phase offset between the clock signals D and E. The phase error signals PE1 can, as an example, indicate which of the clock signals D and E is early or late relative to the other clock signal.

Clock signal F is generated at another one of the leaf nodes of clock network 362 in response to clock signal C. Clock signal F is transmitted outside of IC die 303 (e.g., by an output buffer) to conductors 377 in interposer 350. Clock signal F is transmitted through a U-turn in conductors 377 having a U-shape back to an input pad of IC die 303. Clock signal F is then transmitted from the input pad of IC die 303 to a first input of phase detector circuit 332 (e.g., through an input buffer). Conductors 377 are part of the global clock distribution network in interposer 350. Conductors 377 have a balanced H-tree structure. For example, conductors 377 may be the upper part of a second set of the conductors 121-123 shown in FIGS. 1A and 1C.

As mentioned above, clock signal A is transmitted through conductors 371, 372, and 374 to adjustable delay circuit 313. Adjustable delay circuit 313 delays clock signal A to generate a delayed clock signal G in IC die 304. Adjustable delay circuit 313 may also include an input buffer circuit that buffers clock signal A. Clock signal G is provided to an input of clock network 363 in IC die 304. Clock signal G is transmitted through clock network 363 to 8 leaf nodes of clock network 363. It should be understood that 8 leaf nodes of clock network 363 are shown in FIG. 3 merely as an example and that on-die clock network 363 may have any number of branches and any number of leaf nodes. Clock network 363 is a balanced H-tree clock network, such that the clock signal generated at each of its 8 leaf nodes has the same nominal delay relative to clock signal G.

Clock signal H is generated at one of the leaf nodes of clock network 363 in response to clock signal G. Clock signal H is transmitted outside of IC die 304 (e.g., by an output buffer) to conductor 378 in interposer 350. Conductor 378 is part of the global clock distribution network in interposer 350. Clock signal H is then transmitted through conductor 378, then through an input pad of IC die 303, and then through an input buffer in IC die 303 to a second input of phase detector circuit 332.

Clock networks 362 and 363 have the same nominal delay from their origins at the adjustable delay circuits 312-313, respectively, to their leaf nodes. In addition, the signal paths that clock signals F and H travel from the leaf nodes of clock networks 362 and 363, respectively, to inputs of phase detector 332 have the same nominal. However, process variations between IC dies 303 and 304 may cause clock signals F and H to have a phase offset. Phase detector circuit 332 compares the phase of clock signal F to the phase of clock signal H to generate one or more phase error signals PE2. Phase detector circuit 332 causes the values of the one or more phase error signals PE2 to indicate any phase offset between the clock signals F and H. The phase error signals PE2 can, as an example, indicate which of the clock signals F or H is early or late relative to the other clock signal.

The phase error signals PE1 and PE2 generated by phase detectors 331-332 are provided to inputs of control circuit 320. Control circuit 320 generates clock delay control signals CDC based on the values indicated by the phase error signals PE1 and PE2. Control circuit 320 causes the values of the clock delay control signals CDC to indicate the phase offset between clock signals D and E and/or the phase offset between clock signals F and H. Clock delay control signals CDC are provided to inputs of each of the adjustable delay circuits 311-314, as shown in FIG. 3. As mentioned above, a control circuit 320 may be in each of the three IC dies 302-304. If a control circuit 320 is located in each of the three IC dies 302-304, then each control circuit 320 may generate a separate set of control signals CDC for controlling the adjustable delay circuits in its respective IC die 302, 303, or 304 in response to signals PE1 and/or PE2.

Adjustable delay circuits 311-312 adjust the delays of clock signals B and/or C, respectively, based on the values of the clock delay control signals CDC to reduce or eliminate any phase offset or clock skew between clock signals D and E. Adjustable delay circuits 312-313 adjust the delays of clock signals C and/or G, respectively, based on the values of the clock delay control signals CDC to reduce or eliminate any phase offset or clock skew between clock signals F and H. In an embodiment, a different subset of the clock delay control signals CDC can be provided to each of the adjustable delay circuits 311-314. In an embodiment, adjustable delay circuits 311-313 can adjust the delays of clock signals B, C, and G, respectively, based on an average phase offset as indicated by the values of the clock delay control signals CDC.

Using the embodiment of FIG. 3 for clock distribution and de-skew is advantageous in a programmable logic integrated circuit (IC), because user clock requirements are unpredictable and varying. The amount of programmable clock networks in a typical programmable logic IC may be more than sufficient for some user designs, but not enough for other user designs. There is also significant variation across a large system where some channels in the programmable clock network are heavily utilized and other channels in the clock network are sparsely utilized. The structure of FIG. 3 can be assigned to balanced clock distribution or balanced clock re-convergence on a per-instance basis, and regions of overuse in the ICs can be shifted to less congested channels, especially for clock distribution.

As process technologies that are used to manufacture integrated circuit dies produce on-die circuits with smaller dimensions, more signals are transmitted between the integrated circuit (IC) dies and external sources (e.g., other IC dies). The increasing number of signals use more input/output (I/O) pads on the IC dies, more I/O buffers in the IC dies, and more conductive bumps that connect the IC dies to the interposer. However, there is limited area in each IC die for the increasing number of buffer circuits, I/O pads, and conductive bumps. The specifications for IC fabrication technologies provide a minimum pitch for each of the conductive bumps, a maximum spacing between each adjacent pair of the conductive bumps, and limitations on the locations on the IC die where the conductive bumps can be placed. These specifications limit the number of conductive bumps that can be connected to each IC die. As a result, there may not be sufficient area on an IC die for enough conductive bumps to transmit all of the clock signals, power and ground signals, configuration signals, data signals, and other signals that need to be transmitted to and from the IC die. In addition to not having sufficient area for conductive bumps, the conductive bumps used to transmit clock signals may be spread widely over a large area of the IC die. The widely spread conductive bumps used for clock signals may require longer routing, which may have a penalty on clock skew.

According to some embodiments disclosed herein, the conductive bumps that are coupled to a surface of an integrated circuit (IC) die are shared by input and output clock signals within the same clock domain. By sharing the conductive bumps between input and output clock signals, the number of conductive bumps used for the transmission of clock signals to and from the IC die can be reduced by one-half. Because the number of conductive bumps used for transmitting clock signals is reduced by one-half, the IC die surface area used by the conductive bumps can also be reduced by one-half. To support the sharing of the conductive bumps, each IC die has tri-state input/output buffers that have weak pull-down and weak pull-up modes.

Figure 4:
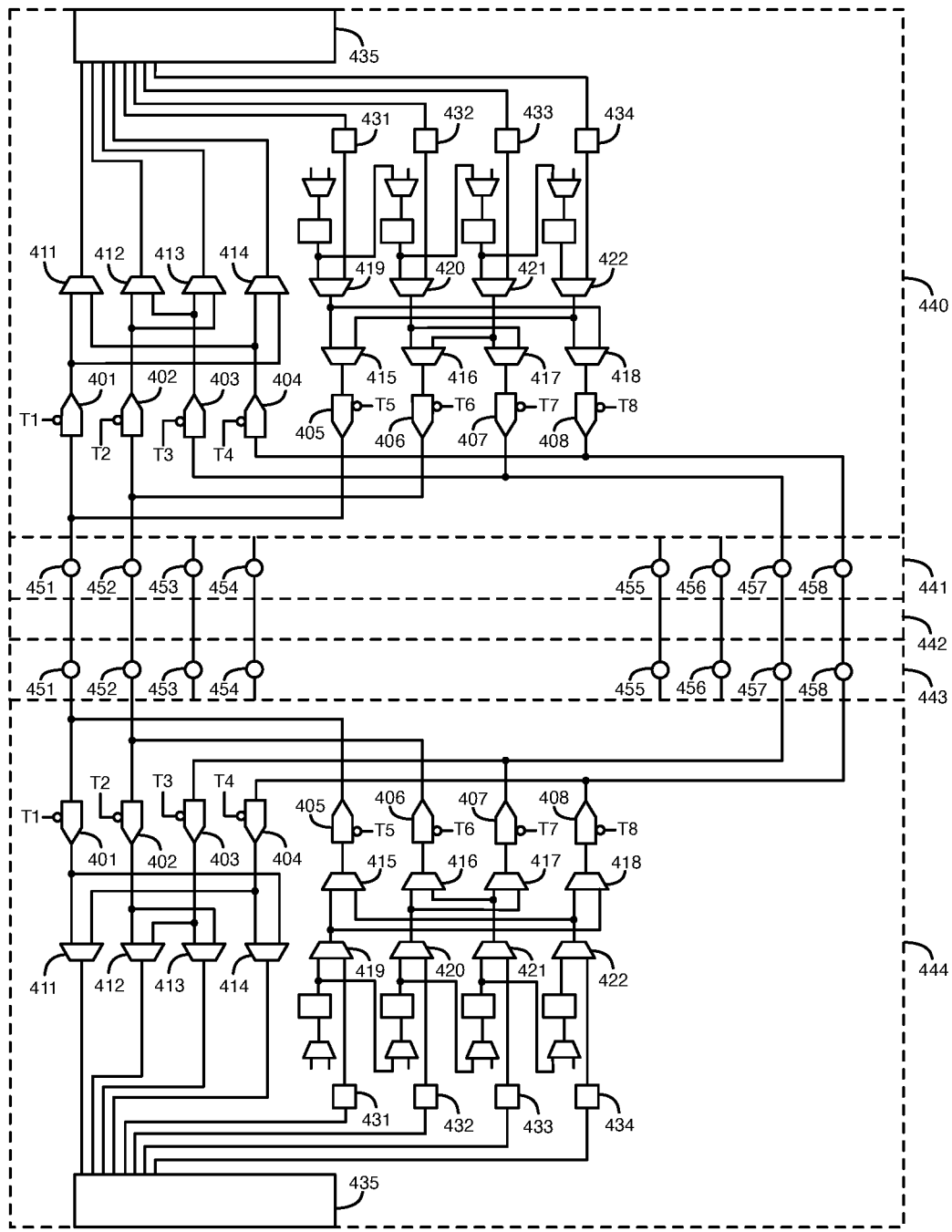
FIG. 4 illustrates an example of a circuit system having shared conductive bumps that couple two integrated circuit dies to an interposer, according to an embodiment.

FIG. 4 illustrates an example of a circuit system having shared conductive bumps that couple two integrated circuit dies to an interposer, according to an embodiment. FIG. 4 illustrates an integrated circuit (IC) die 440, an integrated circuit (IC) die 444, a first conductive bump interface 441, an interposer 442, and a second conductive bump interface 443. IC dies 440 and 444 can be any types of IC dies, such as programmable logic integrated circuits (ICs), microprocessor ICs, graphics processing unit (GPU) ICs, etc. IC die 440 is coupled to conductors in the interposer 442 through the conductive bumps in interface 441. IC die 444 is coupled to conductors in interposer 442 through the conductive bumps in interface 443.

FIG. 4 shows 8 conductive bumps 451-458 in each of the interfaces 441 and 443 as an example. Although, it should be understood that each of the interfaces 441 and 443 can have any number of conductive bumps (e.g., dozens or hundreds of bumps). The conductive bumps 451-458 can have any appropriate size. As an example that is not intended to be limiting, the conductive bumps in each of the interfaces 441 and 443 can be conductive micro-bumps that each has a pitch of 36 micrometers. Although, it should be understood that conductive bumps having other sizes can be used with the techniques disclosed herein.

Each of the IC dies 440 and 444 includes four tri-state input buffer circuits 401-404, four tri-state output buffer circuits 405-408, multiplexer circuits 411-422, programmable inversion (PI) circuits 431-434, and logic circuit area 435. The tri-state buffer circuits 401-408 are controlled by tri-state control signals T1-T8, respectively. Each of the tri-state buffer circuits 401-408 is in one of an enabled mode, a disabled mode, a weak pull-up mode, or a weak pull-down mode. The tri-state control signals T1-T8 are selectively set to values that cause the tri-state buffer circuits 401-408, respectively, to be in the enabled mode, the disabled mode, the weak pull-up mode, or the weak pull-down mode. While buffer circuits 401-404 or 405-408 are in their weak pull-up modes, the buffer circuits generate weak logic high signals at their outputs. While buffer circuits 401-404 or 405-408 are in their weak pull-down modes, the buffer circuits generate weak logic low signals at their outputs.

FIG. 4 shows 4 conductive bumps 451, 452, 457, and 458 in each of interfaces 441 and 443 that are shared between input and output buffer circuits 401-408. Input clock signals and output clock signals can be transmitted through the shared conductive bumps between integrated circuit dies 440 and 444 and interposer 442. As an example, clock signals can be transmitted from IC die 440 through interface 441, interposer 442, and interface 443 to IC die 444. As another example, clock signals can be transmitted from IC die 444 through interface 443, interposer 442, and interface 441 to IC die 440. As yet another example, clock signals can be transmitted from a third IC die through conductors in interposer 442 to one or both of IC dies 440 and 444.

In each of these examples, input clock signals can be transmitted from conductors in interposer 442 through conductive bumps 451-452 and 457-458 to inputs of input buffer circuits 401, 402, 403, and 404, respectively, during an input mode of operation. In order to transmit input clock signals into either of the IC dies 440 or 444 through input buffer circuits 401-404, control signals T1-T4 are set to values that cause each of the input buffer circuits 401-404 to be in the enabled mode during the input mode of operation. Input buffer circuits 401-404 buffer the input clock signals received from bumps 451-452 and 457-458 to generate buffered input clock signals at inputs of multiplexer circuits 411-414. Multiplexer circuits 411-414 are configured to transmit the buffered input clock signals to logic circuit area 435. The buffered input clock signal generated by each of the input buffers 401 and 404 can be transmitted through either of multiplexers 411 or 414. The buffered input clock signal generated by each of the input buffers 402 and 403 can be transmitted through either of multiplexers 412 or 413. The buffered input clock signals can then be transmitted through clock networks to logic circuitry in area 435. While the input buffer circuits 401-404 transmit the input clock signals to circuit area 435 during the input mode of operation, control signals T5-T8 are set to values that cause the output buffer circuits 405-408 be in their disabled modes.

During an output mode of operation, output clock signals can be transmitted from the logic circuit area 435 through output buffer circuits 405-408 and bumps 451-452 and 457-458 to conductors in interposer 442. In order to transmit output clock signals from either one of IC dies 440 or 444 through output buffer circuits 405-408, control signals T5-T8 are set to values that cause each of the output buffer circuits 405-408 to be in the enabled mode during the output mode of operation. The output clock signals are transmitted from logic circuit area 435 through PI circuits 431-434, multiplexer circuits 419-422, and multiplexer circuits 415-418 to inputs of output buffer circuits 405-408, respectively. Multiplexer circuits 415-422 are configured to transmit the output clock signals from PI circuits 431-434 to output buffer circuits 405-408 during the output mode of operation. The output signal of each of multiplexers 419 and 422 can be transmitted through either of multiplexer circuits 415 or 418 to output buffer circuits 405 or 408. The output signal of each of multiplexers 420 and 421 can be transmitted through either of multiplexer circuits 416 or 417 to output buffer circuits 406 or 407. Output buffer circuits 405-408 buffer the output clock signals received from multiplexer circuits 415-418 to generate buffered output clock signals at bumps 451, 452, 457, and 458, respectively.

Thus, the output buffer circuits 405-408 transmit the output clock signals outside the IC die when they are enabled during the output mode of operation. The buffered output clock signals can then be transmitted through conductors in interposer 442 to the other IC die 440 or 444. While the output buffer circuits 405-408 transmit the output clock signals outside the IC die in the output mode of operation, control signals T1-T4 are set to values that cause the input buffer circuits 401-404 to be in input tri-state modes with the outputs of the input buffers 401-404 being in weak pull-up or weak pull-down modes.

Because the conductive bumps are shared between the input and output buffer circuits for transmitting input and output clock signals, the area that is occupied by the conductive bumps is reduced by one-half. As a result, clock skew is reduced as the input and output clock signals cross the conductive bump interfaces. In addition, the size and spacing specifications for the conductive bumps can be satisfied, and enough conductive bumps can be provided on the IC die to transmit all of the input and output signals that the IC die uses to communicate with external devices.

Figure 5:
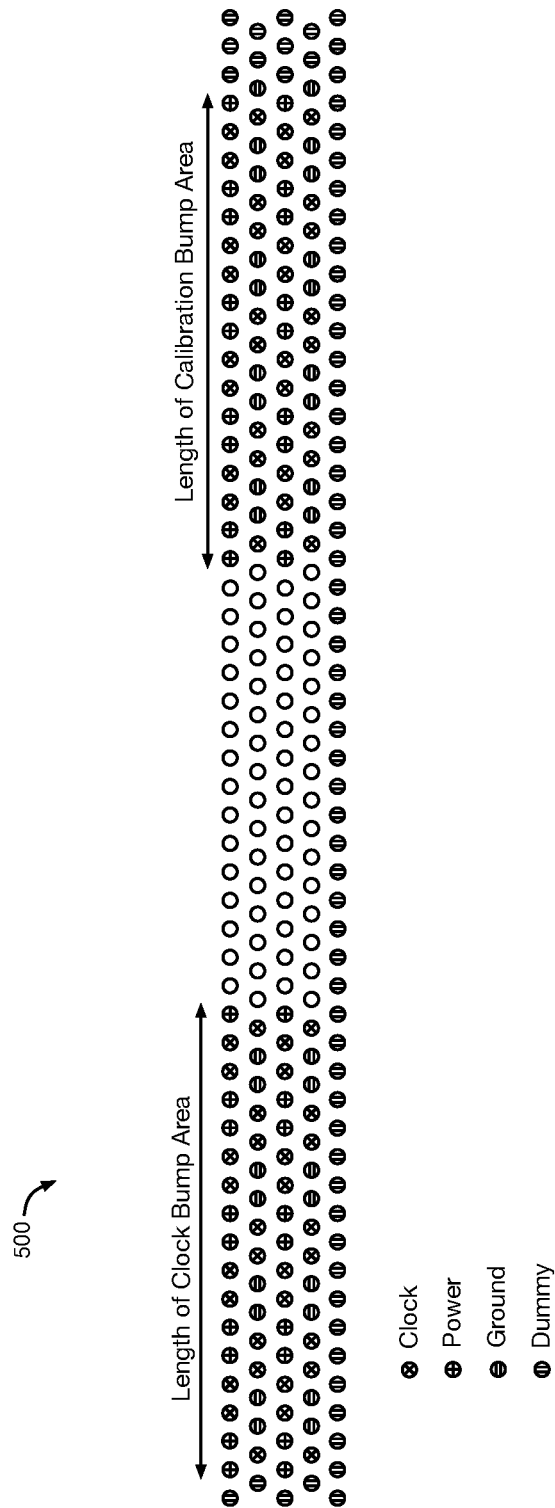
FIG. 5 illustrates an example of a conductive bump interface that couples an integrated circuit die to another device, according to an embodiment.

FIG. 5 illustrates an example of a conductive bump interface 500 that couples an integrated circuit die to another device, according to an embodiment. The conductive bump interface 500 shown in FIG. 5 is an example of each of the conductive bump interfaces 441 and 443 disclosed herein with respect to FIG. 4. The conductive bumps in interface 500 couple an integrated circuit (IC) die to another device. For example, the conductive bumps in interface 500 can couple an IC die to an interposer or to a package substrate. Each of the conductive bumps in interface 500 is connected between a conductive input/output (I/O) pad on a surface of the IC die and another conductive pad on the other device.

Conductive bump interface 500 includes conductive bumps that are used to transmit clock signals, one or more power supply voltages, and a ground voltage. These conductive bumps are referred to herein as clock bumps, power bumps, and ground bumps. Interface 500 also includes dummy bumps that are not used to transmit signals or voltages. The symbols that are used for the clock, power, ground, and dummy bumps in interface 500 are identified below interface 500 in FIG. 5. The conductive bumps in interface 500 can be made of any suitable conductive material, such as metal.

Interface 500 includes 5 rows of conductive bumps. Although, it should be understood that a conductive bump interface can include any number of rows of conductive bumps. The first top row of bumps includes alternating pairs of power and clock bumps. The second row of bumps includes alternating pairs of ground and clock bumps. The third row of bumps includes alternating pairs of power and clock bumps. The fourth row of bumps includes alternating pairs of ground and clock bumps. All of the bumps in the fifth row are dummy bumps. The bumps in the middle of the first, second, third, and fourth rows can be used for transmitting other signals, such as data and control signals. The clock bumps on the right side of interface 500 can be used for transmitting calibration clock signals, and the clock bumps on the left side of interface 500 can be used for transmitting other types of clock signals (e.g., a global clock signal).

Each of the clock bumps in interface 500 is shared for transmitting an input clock signal and an output clock signal, as disclosed herein with respect to FIG. 4. As a result, the length of interface 500 that contains the clock bumps is reduced by half compared to an interface in which each input and output clock signal is driven through a separate bump. As a specific example that is not intended to be limiting, the length of the clock bump area of interface 500 identified in FIG. 5 may be 830 micrometers (μm), which can provide a clock skew across interface 500 of less than 10 picoseconds. As another specific example that is not intended to be limiting, the length of the calibration bump area of interface 500 identified in FIG. 5 may also be 830 μm. A comparable interface area in which each input and output clock signal is driven through a separate conductive bump may have twice the length (e.g., 1660 μm). Interface 500 has 32 clock bumps in the clock bump area on the left side of FIG. 5. An interface in which each input and output clock signal is driven through a separate conductive bump would require twice as many clock bumps (i.e., 64 bumps).

As a result, interface 500 provides an optimized configuration of conductive bumps across an inter-die bridge that increases conductive bump efficiency. Interface 500 can provide better performance with minimum clock skew across the IC die using a narrower area of bumps and shorter bump routes. Interface 500 eliminates the area cost penalty to host sufficient conductive bumps, while increasing signal transfer bandwidth.

The embodiments disclosed herein can be used with any suitable integrated circuits or systems. For example, the embodiments disclosed herein can be used with numerous types of devices such as processor integrated circuits, central processing units, memory integrated circuits, graphics processing unit integrated circuits, application specific standard products (ASSPs), application specific integrated circuits (ASICs), and programmable logic integrated circuits. Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits disclosed in one or more embodiments herein may be part of a data processing system that includes one or more of the following components: a processor; memory; input/output circuitry; and peripheral devices. The data processing system can be used in a wide variety of applications, such as computer networking, data networking, instrumentation, video processing, digital signal processing, or any suitable other application. The integrated circuits can be used to perform a variety of different logic functions.

The following examples pertain to further embodiments. Example 1 is a circuit system comprising: an interposer comprising a first clock network to provide a first clock signal; and first and second integrated circuit dies that are mounted on the interposer, wherein the first integrated circuit die comprises a first phase detector circuit, a first adjustable delay circuit that generates a second clock signal in response to the first clock signal received from the first clock network, and a second clock network that generates a third clock signal in response to the second clock signal, wherein the second integrated circuit die comprises a third clock network that generates a fourth clock signal in response to the first clock signal received from the first clock network, and wherein the first phase detector circuit controls a delay provided by the first adjustable delay circuit to the second clock signal based on a phase comparison between phases of the third and fourth clock signals.

In Example 2, the circuit system of Example 1 can optionally include, wherein the second integrated circuit die further comprises a second adjustable delay circuit that generates a fifth clock signal in response to the first clock signal, and wherein the third clock network generates the fourth clock signal in response to the fifth clock signal, and wherein the first phase detector circuit controls a delay provided by the second adjustable delay circuit to the fifth clock signal based on the phase comparison between the phases of the third and fourth clock signals.

In Example 3, the circuit system of any one of Examples 1-2 can optionally include, wherein the first integrated circuit die further comprises a control circuit that generates control signals for controlling the delay provided by the first adjustable delay circuit to the second clock signal based on phase error signals that are generated by the first phase detector circuit based on the phase comparison between the phases of the third and fourth clock signals.

In Example 4, the circuit system of any one of Examples 1-3 can optionally include, wherein the third clock signal is transmitted from the second clock network to the first phase detector circuit through first conductors in the interposer, and wherein the fourth clock signal is transmitted from the third clock network to the first phase detector circuit through second conductors in the interposer.

In Example 5, the circuit system of any one of Examples 1~4 can optionally further comprise: a third integrated circuit die mounted on the interposer and comprising a fourth clock network that generates a fifth clock signal in response to the first clock signal, wherein the third clock network generates a sixth clock signal in response to the first clock signal, wherein the second integrated circuit die further comprises a second phase detector circuit that controls the delay provided by the first adjustable delay circuit to the second clock signal based on a phase comparison between phases of the fifth and sixth clock signals.

In Example 6, the circuit system of Example 5 can optionally include, wherein the second integrated circuit die further comprises a second adjustable delay circuit that generates a seventh clock signal in response to the first clock signal, wherein the third clock network generates the fourth clock signal in response to the seventh clock signal, and wherein the second phase detector circuit controls a delay provided by the second adjustable delay circuit to the seventh clock signal based on a phase comparison between the phases of the fifth and sixth clock signals.

In Example 7, the circuit system of any one of Examples 5-6 can optionally include, wherein the fifth clock signal is transmitted from the fourth clock network to the second phase detector circuit through first conductors in the interposer, and wherein the sixth clock signal is transmitted from the third clock network to the second phase detector circuit through second conductors in the interposer that are configured in a U-shape.

In Example 8, the circuit system of any one of Examples 1-7 can optionally include, wherein the first integrated circuit die is coupled to the interposer through first conductive bumps, and wherein the second integrated circuit die is coupled to the interposer through second conductive bumps.

Example 9 is a circuit system comprising: an interposer comprising a first clock network; first, second, and third integrated circuit dies that are mounted on and coupled to the interposer, wherein the first integrated circuit die comprises a clock source that generates a first clock signal, wherein the second integrated circuit die comprises a second clock network and a first phase detector circuit, wherein the third integrated circuit die comprises a third clock network, wherein the first clock network is coupled to provide the first clock signal from the first integrated circuit die to the second and third integrated circuit dies, wherein a second clock signal generated by the second clock network in response to the first clock signal is provided through the first clock network to the first phase detector circuit, and wherein a third clock signal generated by the third clock network in response to the first clock signal is provided through the first clock network to the first phase detector circuit.

In Example 10, the circuit system of Example 9 can optionally include, wherein the first clock signal is a global clock signal, and wherein the first clock network is a global clock distribution network.

In Example 11, the circuit system of any one of Examples 9-10 can optionally include, wherein the second integrated circuit die further comprises a first adjustable delay circuit that is coupled to generate a fourth clock signal in response to the first clock signal, wherein the second clock network generates the second clock signal in response to the fourth clock signal, and wherein the first phase detector circuit controls a delay provided by the first adjustable delay circuit to the fourth clock signal based on a phase comparison between phases of the second and third clock signals.

In Example 12, the circuit system of Example 11 can optionally include, wherein the second integrated circuit die further comprises a control circuit that generates control signals for controlling the delay provided by the first adjustable delay circuit to the fourth clock signal based on phase error signals that are generated by the first phase detector circuit based on the phase comparison between the phases of the second and third clock signals.

In Example 13, the circuit system of any one of Examples 11-12 can optionally include, wherein the third integrated circuit die further comprises a second adjustable delay circuit that generates a fifth clock signal in response to the first clock signal, wherein the third clock network generates the third clock signal in response to the fifth clock signal, and wherein the first phase detector circuit controls a delay provided by the second adjustable delay circuit to the fifth clock signal based on the phase comparison between the phases of the second and third clock signals.

In Example 14, the circuit system of Example 13 can optionally include, wherein the third clock network generates a sixth clock signal in response to the fifth clock signal, and wherein the third integrated circuit die further comprises a second phase detector circuit that controls a delay provided by the second adjustable delay circuit to the fifth clock signal based on a phase comparison between phases of the sixth clock signal and a seventh clock signal.

In Example 15, the circuit system of any one of Examples 9-14 can optionally further comprise: a fourth integrated circuit die mounted on and coupled to the interposer, wherein a fourth clock network in the fourth integrated circuit die generates the seventh clock signal in response to the first clock signal.

In Example 16, the circuit system of Example 15 can optionally include, wherein the sixth clock signal is provided to the second phase detector circuit through the first clock network, and wherein the seventh clock signal is provided from the fourth integrated circuit die to the second phase detector circuit through the first clock network.

Example 17 is an integrated circuit die comprising: input buffer circuits coupled to conductive bumps, wherein each of the input buffer circuits is coupled to one of the conductive bumps, and wherein the input buffer circuits are enabled during an input mode of operation in response to first control signals to transmit input clock signals into the integrated circuit die from the conductive bumps; and output buffer circuits coupled to the conductive bumps, wherein each of the output buffer circuits is coupled to one of the conductive bumps, and wherein the output buffer circuits are enabled during an output mode of operation in response to second control signals to transmit output clock signals from the integrated circuit die to the conductive bumps, wherein the input buffer circuits are disabled from transmitting signals during the output mode of operation in response to the first control signals, and wherein the output buffer circuits are disabled from transmitting signals during the input mode of operation in response to the second control signals.

In Example 18, the integrated circuit die of Example 17 can optionally include, wherein the input buffer circuits are in weak pull-up or weak-pull-down modes during the output mode of operation in response to the first control signals.

In Example 19, the integrated circuit die of any one of Examples 17-18 can optionally further comprise: first multiplexer circuits that are coupled to inputs of the output buffer circuits, wherein the first multiplexer circuits are configured to transmit the output clock signals to the inputs of the output buffer circuits during the output mode of operation.

In Example 20, the integrated circuit die of Example 19 can optionally further comprise: a logic circuit area; and second multiplexer circuits that are coupled to outputs of the input buffer circuits, wherein the second multiplexer circuits are configured to transmit the input clock signals from the outputs of the input buffer circuits to the logic circuit area during the input mode of operation.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A method for transmitting input clock signals and output clock signals using a first integrated circuit die, wherein the method comprises:
   enabling input buffer circuits in the first integrated circuit die during an input mode of operation in response to first control signals;
   disabling output buffer circuits in the first integrated circuit die during the input mode of operation in response to second control signals;
   transmitting the input clock signals from a second integrated circuit die through an interposer, through conductive bumps, and through the input buffer circuits into the first integrated circuit die during the input mode of operation;
   enabling the output buffer circuits in the first integrated circuit die during an output mode of operation in response to the second control signals, wherein each of the input buffer circuits and each of the output buffer circuits is coupled to one of the conductive bumps; and
   transmitting the output clock signals from the first integrated circuit die through the output buffer circuits, through the interposer, and through the conductive bumps into the second integrated circuit die during the output mode of operation.

2. The method of claim 1, further comprising causing outputs of the input buffer circuits to be in weak pull-up or weak pull-down modes during the output mode of operation in response to the first control signals.

3. The method of claim 1 further comprising:
   transmitting the output clock signals to inputs of the output buffer circuits through first multiplexer circuits during the output mode of operation.

4. The method of claim 3 further comprising:
   transmitting the output clock signals to inputs of the first multiplexer circuits through second multiplexer circuits during the output mode of operation.

5. The method of claim 1 further comprising:
   transmitting the input clock signals from outputs of the input buffer circuits to a logic circuit area through multiplexer circuits during the input mode of operation.

6. The method of claim 1, wherein disabling the output buffer circuits during the input mode of operation further comprises causing the output buffer circuits to be in disabled modes during the input mode of operation in response to the second control signals.

7. The method of claim 1, wherein the conductive bumps are arranged in pairs that alternate between pairs of power bumps.

8. The method of claim 7, wherein the conductive bumps are arranged in pairs that alternate between pairs of ground bumps.

9. A circuit system comprising:
   a first integrated circuit die comprising first input buffer circuits and first output buffer circuits;
   a second integrated circuit die comprising second input buffer circuits and second output buffer circuits; and
   an interposer coupled to the first integrated circuit die and to the second integrated circuit die, wherein the second output buffer circuits are enabled during a first output mode of operation in response to first control signals and the first input buffer circuits are enabled during a first input mode of operation in response to second control signals to transmit first clock signals from the second integrated circuit die through the interposer and through conductive bumps to the first integrated circuit die; and
   wherein the first output buffer circuits are enabled during a second output mode of operation in response to third control signals and the second input buffer circuits are enabled during a second input mode of operation in response to fourth control signals to transmit second clock signals from the first integrated circuit die through the interposer and through the conductive bumps to the second integrated circuit die.

10. The circuit system of claim 9, wherein the first input buffer circuits are disabled during the second output mode of operation in response to the second control signals, and wherein the second output buffer circuits are disabled during the second input mode of operation in response to the first control signals.

11. The circuit system of claim 10, wherein the second input buffer circuits are disabled during the first output mode of operation in response to the fourth control signals, and wherein the first output buffer circuits are disabled during the first input mode of operation in response to the third control signals.

12. The circuit system of claim 9, wherein the conductive bumps are arranged in pairs that alternate between pairs of power bumps.

13. The circuit system of claim 9, wherein the conductive bumps are arranged in pairs that alternate between pairs of ground bumps.

14. The circuit system of claim 9, wherein the first integrated circuit die further comprises first multiplexer circuits coupled to transmit the second clock signals to the first output buffer circuits during the second output mode of operation.

15. The circuit system of claim 14, wherein the first integrated circuit die further comprises second multiplexer circuits coupled to transmit the second clock signals to the first multiplexer circuits during the second output mode of operation.

16. The circuit system of claim 9, wherein the first integrated circuit die further comprises multiplexer circuits coupled to transmit the first clock signals from the first input buffer circuits to a logic circuit area in the first integrated circuit die.

17. The circuit system of claim 9, wherein outputs of the first input buffer circuits are in weak pull-up or weak pull-down modes during the second output mode of operation.

18. The circuit system of claim 9, wherein the first integrated circuit die is a programmable logic integrated circuit.

19. The circuit system of claim 9, wherein the second integrated circuit die is a programmable logic integrated circuit.

\* \* \* \* \*